US012265046B2

(12) United States Patent
Sakhuja et al.

(10) Patent No.: US 12,265,046 B2
(45) Date of Patent: Apr. 1, 2025

(54) HETEROSTRUCTURE SEMICONDUCTOR, CHEMIRESISTIVE GAS SENSOR MADE THEREOF, AND METHOD OF FABRICATION THEREOF

(71) Applicant: INDIAN INSTITUTE OF SCIENCE, Bangalore (IN)

(72) Inventors: Neha Sakhuja, Bengaluru (IN); Ravindra Kumar Jha, Bengaluru (IN); Ranajit Sai, Bengaluru (IN); Navakanta Bhat, Bengaluru (IN)

(73) Assignee: INDIAN INSTITUTE OF SCIENCE, Bangalore (IN)

( * ) Notice: Subject to any disclaimer, the term of this patent is extended or adjusted under 35 U.S.C. 154(b) by 721 days.

(21) Appl. No.: 17/398,169

(22) Filed: Aug. 10, 2021

(65) Prior Publication Data

US 2022/0042941 A1 Feb. 10, 2022

(30) Foreign Application Priority Data

Aug. 10, 2020 (IN) .............................. 202041034329

(51) Int. Cl.
| | |
|---|---|
| *G01N 27/12* | (2006.01) |
| *C23C 26/00* | (2006.01) |
| *H01L 21/02* | (2006.01) |
| *H01L 29/06* | (2006.01) |
| *H01L 29/267* | (2006.01) |

(52) U.S. Cl.
CPC .......... *G01N 27/127* (2013.01); *C23C 26/00* (2013.01); *H01L 21/02628* (2013.01); *H01L 29/0676* (2013.01); *H01L 29/267* (2013.01)

(58) Field of Classification Search
CPC .............................. C23C 26/00; G01N 27/127
See application file for complete search history.

(56) References Cited

FOREIGN PATENT DOCUMENTS

CN 107991353 B 4/2020

OTHER PUBLICATIONS

Dwiputra, The Enhanced Performance of Capacitive-Type Humidity Sensors Based on ZnO Nanorods/WS2 Nanosheets Heterostructure, 2020 (Year: 2020).*
Tahir, Synthesis of Hierarchically Grown ZnO@NT-WS2 Nanocomposites, 2009 (Year: 2009).*
Sakhuja, ZnO Nanorods Grown on WS2 Nanosheets for Chemiresistive H2S Sensing, 2022 (Year: 2022).*

(Continued)

*Primary Examiner* — Syed I Gheyas
*Assistant Examiner* — Casey Paul Boatman
(74) *Attorney, Agent, or Firm* — Cozen O'Connor

(57) ABSTRACT

An example heterostructure semiconductor for sensing a gas comprises a substrate made of nanosheets of a compound of a first metal, wherein the compound of the first metal is sensitive to the gas to be sensed; one or more 1-Dimensional (1D) components fabricated on a surface of the substrate, the 1D components comprising a compound of a second metal, wherein the compound of the second metal is selective to the gas to be sensed; and a 2-Dimensional (2D) layer formed on the surface of the substrate in portions excluding the 1D components, wherein the 2D layer comprises compounds of the first and second metal. Method of fabrication of the heterostructure semiconductor and a chemiresistive sensor made thereof are also disclosed.

20 Claims, 10 Drawing Sheets

(56) References Cited

OTHER PUBLICATIONS

Joshi et al., "A review on chemiresistive room temperature gas sensors based on metal oxide nanostructures, graphene and 2D transition metal dichalcogenides" Oct. 3, 2018, Microchimica Acta (2018) 185: 213, 16 pages.

Nunes, et al., "Metal Oxide Nanostructures for Sensor Applications", i3N/CENIMAT, Department of Materials Science, Faculty of Sciences and Technology, Semiconductor Science and Technology, vol. 34, No. 4, 179 pages.

* cited by examiner

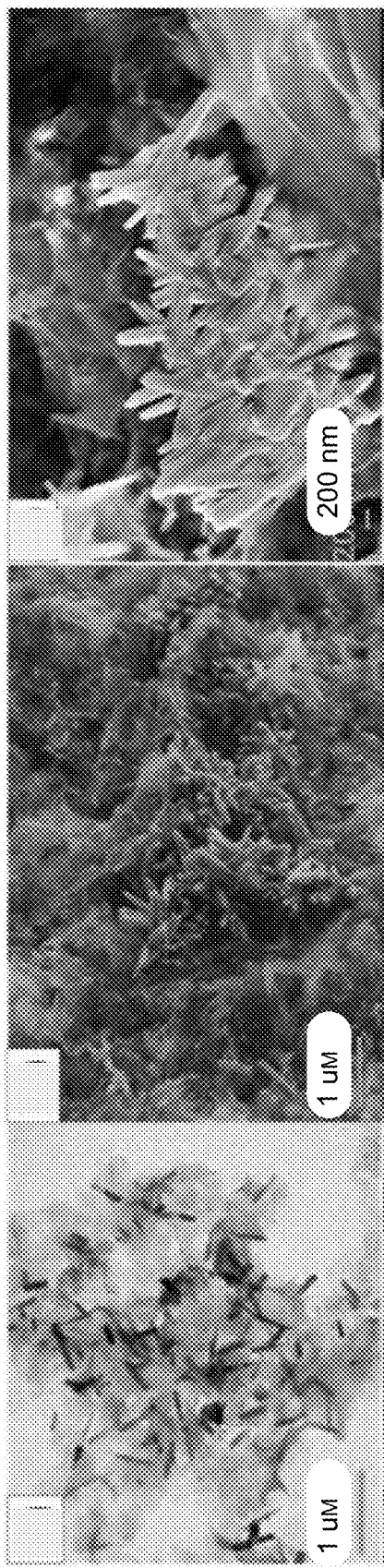
Fig. 6A Fig. 6B Fig. 6C Fig. 6D Fig. 6E Fig. 6F

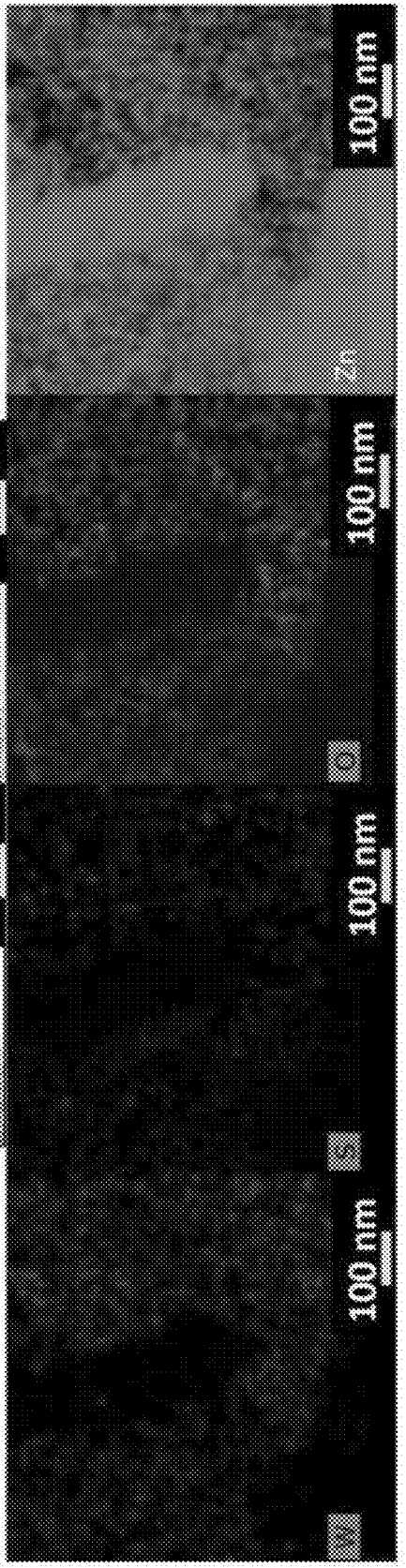
Fig. 7A  Fig. 7B  Fig. 7C  Fig. 7D  Fig. 7E  Fig. 7F

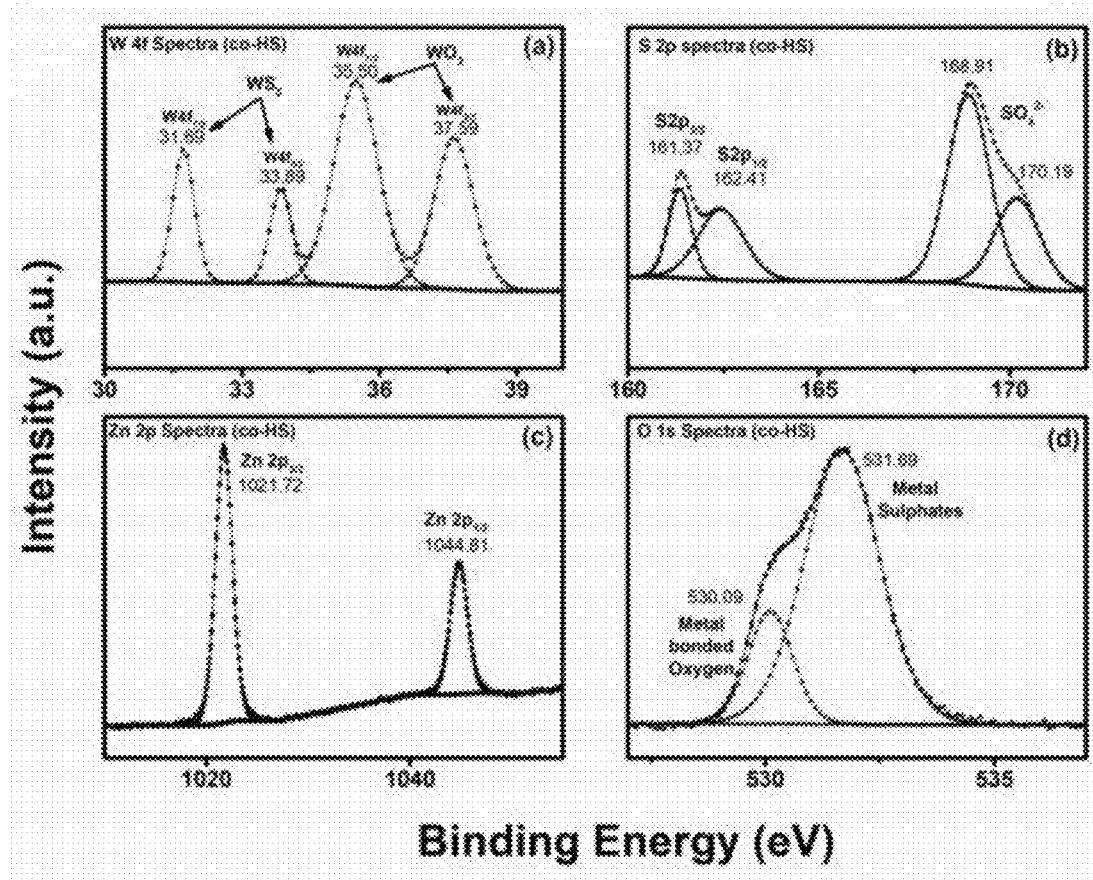

HETEROSTRUCTURE SEMICONDUCTOR, CHEMIRESISTIVE GAS SENSOR MADE THEREOF, AND METHOD OF FABRICATION THEREOF

TECHNICAL FIELD

The present subject matter relates in general to heterostructure semiconductors for gas sensing, chemiresistive sensors made thereof, and methods of fabrication thereof.

BACKGROUND

Sensing of gases is essential for several applications. For example, sensing of hydrogen sulfide may help in detection of leaks in oil refineries, petroleum refineries; sensing of hydrogen sulfide in breath may help in diagnosis of diseases, such as lung cancer, liver cancer, and the like; and sensing of hydrogen sulfide in food packaging may help in checking freshness of food. Different techniques are used for sensing of gases, for example, optical, acoustic, colorimetric, electrochemical, piezoelectric, gas chromatography, and capacitive. However, some of these techniques are generally not handy and are not scalable. Further, while some of these techniques provide high sensitivity, they may not provide high selectivity.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 6A depicts a large area FESEM image of the heterostructure semiconductor, in accordance with an implementation of the present subject matter.

FIG. 6B depicts a low magnification TEM image of the heterostructure semiconductor, in accordance with an implementation of the present subject matter.

FIG. 6C depicts a cross sectional SEM image of the heterostructure semiconductor, in accordance with an implementation of the present subject matter.

FIG. 6D depicts a low magnification TEM image of the heterostructure semiconductor, in accordance with an implementation of the present subject matter.

FIG. 6E depicts a low magnification TEM micrograph of the heterostructure semiconductor, in accordance with an implementation of the present subject matter.

FIG. 6F depicts the high resolution TEM image of the heterostructure semiconductor, in accordance with an implementation of the present subject matter.

FIGS. 7A-7F depict the HAADf-STEM images of the heterostructure semiconductor, in accordance with an implementation.

FIG. 9A-9D depict spectra obtained from XPS studies of the heterostructure semiconductor, in accordance with an implementation of the present subject matter.

DETAILED DESCRIPTION

Figure 1:
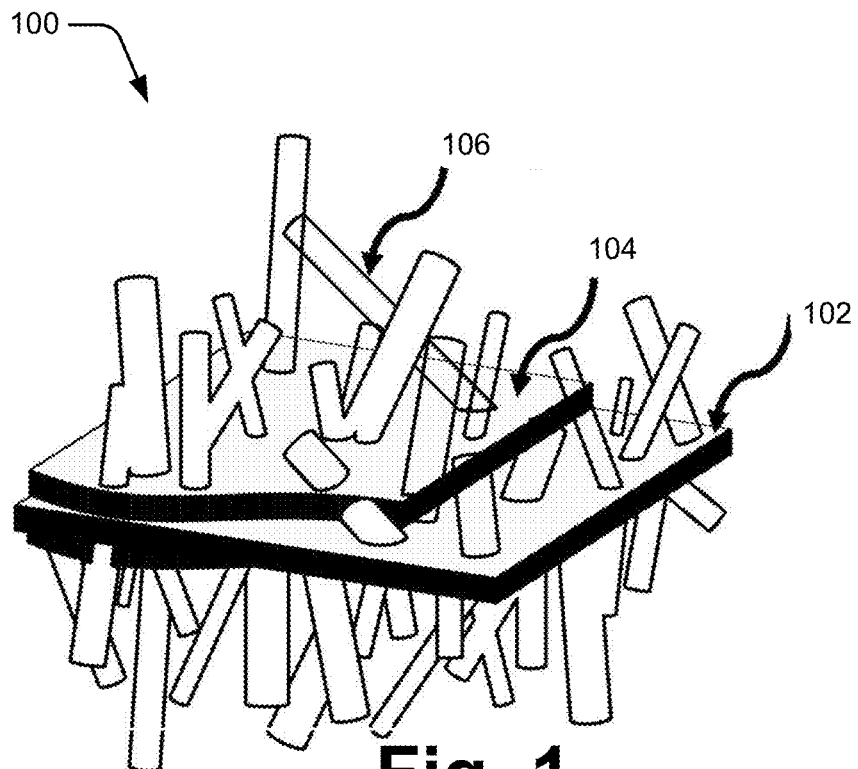
FIG. 1 illustrates an example heterostructure semiconductor, in accordance with an implementation of the present subject matter.

The present subject matter provides heterostructure semiconductors which can be used for sensing of gases, chemiresistive sensors made from the heterostructure semiconductors, and methods of fabrication of such heterostructure semiconductors. For ease of discussion, heterostructure semiconductors are interchangeably referred to as heterostructures hereinafter.

Several techniques are available for sensing of gases. Some of these techniques are optical, acoustic, colorimetric, electrochemical, piezoelectric, gas chromatography, and capacitive. However, these techniques have shortcomings. For example, gas chromatography is a bench-top technique and cannot be easily miniaturized for easy deployment in industrial setting. While the electrochemical technique can be miniaturized, electrolytes used during electrochemical sensing of gases decreases due to humidity, reducing its efficacy with time.

Typically, when a gas sensor is used for disease diagnosis and in food packaging industry, sensitivity and selectivity of the gas sensor should be high. For example, hydrogen sulfide as low as 500 ppb may have to be detected for diagnosis of diseases and as low as 1 ppm may have to be detected in food industry. However, the abovementioned techniques provide low selectivity and low sensitivity. Hence, there is a requirement for a more robust and simpler device which is compatible with current CMOS technology for miniaturization.

Another technique used for gas sensing is the chemiresistive method. In chemiresistive sensors, interdigitated sensing electrodes are provided on an insulator. The interdigitated sensing electrodes may be fabricated, for example, from platinum and the insulator may be fabricated, for example, from silicon dioxide. A sensing material is provided on the interdigitated sensing electrodes. On contacting with the gas to be detected, the gas can oxidize/reduce (depending on nature of gas) the sensing material which, in turn, provides a current. The current can be sensed using the interdigitated sensing electrodes and be correlated to the concentration of the gas.

Conventionally, the sensing material in chemiresistive sensors may be selected from Metal Oxide Semiconductors (MOS), polymers, carbon nanotubes (CNTs), and Metal Organic Frameworks. However, chemiresistive sensors with these materials are difficult to fabricate and provide low repeatability. For example, chemiresistive sensors with MOS as sensing material may require high temperatures for fabrication. Further, these sensing materials tend to degrade with time. For example, polymers and CNTs in chemiresistive sensors are unstable at nanoscale and have a low shelf life.

Another material which may be used as sensing material are Two-dimensional (2D) materials. 2D materials are crystalline materials which are made of a single layer of atoms. In particular, transition metal dichalcogenides (TMDs) may be used as sensing material. TMDs provide high sensitivity due to their surface reactivity. However, TMDs based sensors have selectivity issues. Further these pristine 2D materials are prone to instability even at low temperatures by the significant adsorption of oxygen in ambient air. They also show slow recovery, i.e., they are sluggish in returning to their original state when contact with gas to be detected is stopped.

2D materials may be used in conjunction with other sensing materials to form hybrids for sensing of gases. For example, TMDs may be used with MOS to form hybrids for sensing of gases. Typically, fabrication of such hybrids is challenging as it requires high temperature and controlled environments to obtain a neat interface between the materials. High temperature processes are cumbersome and are generally not scalable.

The present subject matter addresses these and other problems with conventional gas sensors and methods of fabrication thereof. The present subject matter provides a heterostructure for gas sensing, a chemiresistive sensor comprising the heterostructure, and a method of fabrication of the heterostructure.

In one example, a heterostructure semiconductor comprises a substrate, one or more 1-Dimensional (1D) components fabricated on a surface of the substrate, and a 2-Dimensional (2D) layer formed on the surface of the substrate in portions excluding the 1D components. The substrate is made of nanosheets of a compound of a first metal, such as sulfides of transition metals or transition metal dichalcogenides. The compound of the first metal is sensitive to the gas to be sensed. The 1D components comprise a compound of a second metal, wherein the compound of the second metal is selective to the gas to be sensed. Further, the 2D layer comprises compounds of the first and second metal. In one example, an abrupt interface exists between the substrate and the 1D components; and a longitudinal axis of each of the 1D components is at angle to a plane of the substrate.

The heterostructure as described above helps in providing high surface to volume ratio for high sensitivity, more active sites for enhanced sensor performance, and high selectivity. The abrupt interface between the 1D component and the substrate also helps in avoiding sluggishness and improving response time and recovery time when the heterostructure is used in a chemiresistive sensor. Further, the heterostructure helps in improving selectivity. The 2D layer, and the 1D component co-exist on the substrate, i.e., the 1D component and the 2D layer nucleate on the substrate. This is different from a ternary layer where the different layers are formed on top of each other.

In one example, the 1D components are nanorods or nanotubes. In one example, the first metal is selected from tungsten and molybdenum and the second metal is selected from zinc, nickel, and iron. In one example, the heterostructure the compound of the first metal forming the nanosheets of the substrate is a transition metal dichalcogenide (TMD). In one example, the compound of the second metal forming the 1D component is a metal oxide. In one example, the 2D layer comprises sulfates and oxides of first and second metals. In one example, the gas to be sensed is hydrogen sulfide, the substrate is made of tungsten disulfide, the 2D layer comprises oxides and sulphates of tungsten and zinc, and the 1D component comprises zinc oxide. In one example, the substrate has a thickness of 2-100 atomic layers, preferably 4 atomic layers, and a lateral dimension of 100-1000 nm, preferably 300 nm. In one example, the 1D component has a length in a range of 10-10000 nm, preferably 500-1000 nm, and diameter in a range of 10-200 nm, preferably 60-80 nm.

Example methods for fabrication of a heterostructure semiconductor for sensing a gas are also disclosed. An example method comprises obtaining a substrate, wherein the substrate is made of nanosheets of a compound of a first metal, wherein the compound of the first metal is sensitive to the gas to be sensed. A solution of a precursor of a 1D component to be formed on the substrate is obtained. The 1D component is made of a compound of a second metal, wherein the compound of the second metal is selective to the gas to be sensed. The solution of the precursor of the 1D component is contacted with the substrate to obtain a first mixture. The first mixture is irradiated with microwaves to form the heterostructure. The heterostructure thus formed comprises one or more of the 1-Dimensional (1D) components fabricated on a surface of the substrate and a 2-Dimensional (2D) layer formed on the surface of the substrate in portions excluding the one or more of the 1-Dimensional (1D) components, wherein the 2D layer comprises compounds of the first and second metal. Thus, the synthesis of the heterostructure is simple and can be easily scaled up for synthesis in bulk.

In one example, the irradiation is performed at a temperature of 75-300 deg C., preferably 150 deg C. In one example, the irradiation is performed with microwaves at a frequency of 2.45 GHz and power of 50 W-500 W in continuous or cycling mode. In one example, in the cycling mode, the irradiation is performed for a total time of 2 min-20 min with pulse ON time of 10-120 s. In one example, the precursor of the 1D component is selected from the group consisting of Zinc (II) acetylacetonate, Zinc nitrate hexahydrate, Zinc acetate dihydrate, Nickel (II) acetylacetonate, Fe(II)acetylacetonate, and metal organic precursors from β-diketonate group. In one example, the solution of the precursor comprises 0.1 mM to 10 mM of the precursor dissolved in 1-100 volume % of ethanol in water mixture. In one example, the gas to be sensed is hydrogen sulfide, the substrate is made of tungsten disulfide, the 2D layer comprises oxides and sulphates of tungsten and zinc, and the 1D component comprises zinc oxide. In one example, the substrate is obtained by: exfoliating bulk material of the compound of the first metal to obtain 2D nanosheets by dispersing the bulk material in a dispersing medium and sonicating the dispersion, centrifuging the sonicated bulk material to obtain a supernatant dispersion, and separating the 2D nanosheets from the supernatant dispersion. In one example, for exfoliation, 5-20 mg of bulk material is added per milliliter of the dispersion medium comprising an ethanol and water mixture of 45-75 volume % of ethanol and sonicated for 3-6 hours, and the centrifugation is performed for 30-60 minutes at 2500-4500 rpm to obtain the 2D nanosheets having 2-100 atomic layers and a lateral dimension of 100-1000 nm.

The heterostructure of the present subject matter provides high sensitivity, selectivity, and prompt detection. The heterostructure provides hydrogen sulfide ($H_2S$) detection in the range of 100 ppb to 5 ppm. The chemiresistive sensor made of the heterostructure also provides improved recovery time. The fabrication of the heterostructure is simple and does not need high thermal conditions. Hence, the fabrication is scalable for bulk manufacture of the heterostructures and, consequently, the chemiresistive sensors. Further, the heterostructure can be fabricated depending on the gas to be detected. For example, the 1D component may be fabricated from zinc oxide for detection of hydrogen sulfide.

Chemiresistive sensors made using the heterostructure and setup for detecting gas using the chemiresistive sensors are also disclosed. An example chemiresistive sensor comprises interdigitated electrodes, the heterostructure semiconductor of the present subject matter being deposited on the interdigitated electrode to bridge the interdigitated electrodes, a potential generator to apply potential across the interdigitated electrodes, a measurement device to measure an electrical parameter across the interdigitated electrodes, and a controller to control the potential applied and detect and quantify the gas sensed by the heterostructure electrodes based on the measured electrical parameter.

The above and other features, aspects, and advantages of the subject matter will be better explained with regard to the following description and accompanying figures. It should be noted that the description and figures merely illustrate the principles of the present subject matter along with examples described herein and, should not be construed as a limitation to the present subject matter. It is thus understood that various arrangements may be devised that, although not explicitly described or shown herein, embody the principles of the present disclosure. Moreover, all statements herein reciting principles, aspects, and examples thereof, are intended to encompass equivalents thereof. Further, for the sake of simplicity, and without limitation, the same numbers are used throughout the drawings to reference like features and components.

FIG. 1 illustrates an example heterostructure semiconductor 100, in accordance with an implementation of the present subject matter. The heterostructure semiconductor 100 comprises a substrate 102, a 2D layer 104, and one or more 1D components 106. The 1D component(s) 106 may be fabricated on a surface of the substrate 102, while the 2D layer 104 may be formed on the surface of the substrate 102 in portions excluding the 1D component(s) 106.

The substrate 102 may be made of nanosheets of a compound of a first metal and the 1D components 106 may be made of a compound of a second metal. The 2D layer 104 may include compounds of the first and second metals in a 2D structure. In one example, the substrate 102 may have high sensitivity to the gas to be sensed, while the 2D layer 104 and the 1D components may have high selectivity to the gas to be sensed.

In the heterostructure semiconductor 100, the 2D layer 104 and the 1D components 106 co-exist on the substrate 102. As will be understood, a 2-dimensional or 2D structure is a structure that extends primarily in two dimensions and has a very small thickness in the third dimension, thereby giving it an appearance of being two dimensional. The 2D structure thus may be considered to lie in a plane formed by the two dimensions along which it extends. Similarly, a 1-dimensional or 1D structure is a structure that extends primarily in one direction and has very small breadth in the other two dimensions, thereby giving it an appearance of being one dimensional. The dimension along which the 1D structure extends is also referred to as its longitudinal axis for the purposes of discussion.

Further, in the heterostructure semiconductor 100, there exists an abrupt interface between the substrate 102 and the 1D component 106. An abrupt interface refers to a sharp boundary between two chemically dissimilar structures. Since the 2D layer 104 includes compounds of both the first and second metal, the interfaces between the 2D layer 104 and the substrate 102, and the 2D layer 104 and the 1D component 106 are relatively defect free than the interface between the substrate 102 and the 1D component 106 which are made of compounds of different metals and therefore form an abrupt interface.

The substrate 102 may be fabricated from nanosheets of a 2D material, i.e., a material having thickness of the order of a few atomic layers and extending primarily in two dimensions. In one example, the substrate 102 is fabricated from bulk transition metal dichalcogenides (TMDs). Transition metal dichalcogenides are atomically thin semiconductors of the type $MX_2$, with M being a transition metal atom, such as Mo, W, etc., and X a chalcogen atom, such as O, S, Se, Te. Accordingly, the first metal may be Mo, W, etc. In a monolayer of TMD, one layer of M atoms is sandwiched between two layers of X atoms. The substrate 102 may have 2-100 atomic layers of the TMD stacked one above the other. In one example, the TMD is selected from one of tungsten disulfide and molybdenum disulfide. The 2D material may be selected based on the gas to be sensed. For example, when the gas to be sensed is hydrogen sulfide, the substrate 102 may be tungsten disulfide.

To improve selectivity of the heterostructure semiconductor 100 to a target gas, the 1D components 106 and the 2D layer 104 may be formed on the substrate 102. For example, when used for sensing and detection of hydrogen sulfide, the tungsten disulfide substrate may show sensitivity to both hydrogen sulfide and ammonia. The 2D layer 104 and the 1D components 106 help in improving the selectivity. For example, the 2D layer 104 may block reactive areas on the surface of the substrate 102 and may selectively react with the gas to be sensed, while the 1D components 106 may be selective only towards the gas to be detected.

In one example, the 2D layer 104 may be rich in oxides and sulphates. The 2D layer 104 may be a patchy or amorphous layer which is nucleated on the surface of the substrate 102. In one example, the 2D layer 104 may be formed on a first surface of the substrate 102. In another example, the 2D layer 104 may be formed both on the first surface and a second surface opposite to the first surface. In one example, the 2D layer 104 may have varying thickness along the thickness of the substrate 102, i.e., the 2D layer 104 may be formed non-uniformly on the surface of the substrate 102. Further, the 2D layer 104 may be formed on portions of the substrate 102 such that it excludes the portion on the surface of the substrate 102 on which the 1D components 106 are formed. The 2D layer 104 may thus be a non-continuous structure formed on the substrate 102.

The 1D components 106 may also be formed on the substrate 102 and may be present in the patches/pockets of the surface of the substrate 102 that are not covered by the 2D layer 104. In one example, the 1D components 106 may be nanorods or nanotubes. The 1D components 106 may be formed such that a longitudinal axis of each of the 1D components 106 forms an angle with a plane of the substrate 102. The angle may be, for example, between 15 to 150 degrees. In one example, the 1D components 106 may be formed only on a first surface of the substrate 102. In another example, the 1D components 106 may be formed on both the first surface and the second surface of the substrate opposite to the first surface. In one example, length of the 1D components 106 is in a range of 500-1000 nm and diameter of the 1D components 106 is in a range of 60-80 nm.

The 1D components 106 may be selected from metal oxides, such as, zinc oxide, nickel oxide, ferrous oxide, ferric oxide, and the like. Accordingly, the second metal may be zinc, nickel, or the like. The 1D components 106 may be selected based on the gas to be sensed. For example, when the gas to be sensed is hydrogen sulfide, the 1D components 106 may be formed of zinc oxide.

In one example, when the gas to be sensed is hydrogen sulfide, the substrate 102 is fabricated from tungsten disulfide, the 2D layer 104 comprises sulphates and oxides of zinc and tungsten, and the 1D component 106 is made of zinc oxide. In said example, when the hydrogen sulfide is contacted with the sulphates in the 2D layer, the sulphates are reduced to sulfides in accordance with equation 1:

$$SO_4^{2-} \rightarrow S^{2-} \qquad \text{equation (1)}$$

Further, the zinc oxide in the 1D components 106 reacts with the hydrogen sulfide to form zinc sulfide in accordance with equation 2:

$$ZnO + H_2S \rightarrow ZnS + H_2O \qquad \text{equation (2)}$$

The oxidation of the 2D layer 104 and the 1D components 106 as described above provides a relative change in current which is proportional to the concentration of the hydrogen sulfide with which the heterostructure semiconductor 100 is contacted. The relative change in current can be measured and correlated with the concentration of the gas for sensing the gas. For this, a chemiresistive sensor may be made using the heterostructure semiconductor 100.

Figure 2:
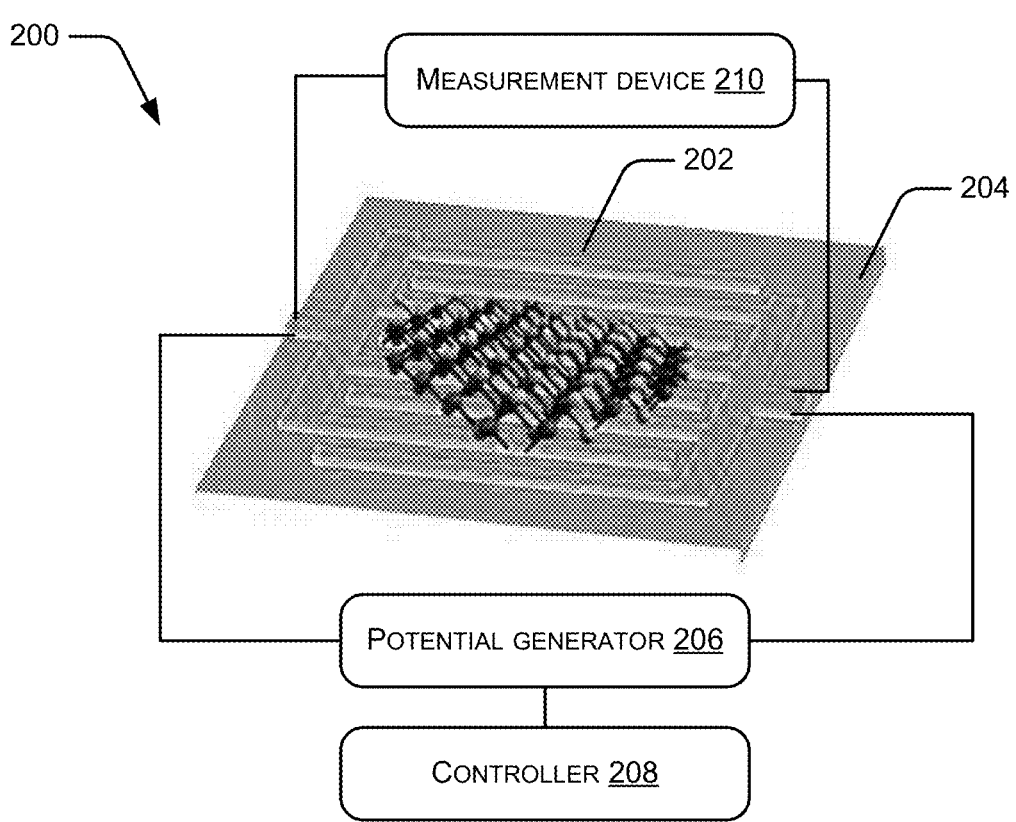
FIG. 2 depicts a pictorial representation of an example chemiresistive sensor, in accordance with an implementation of the present subject matter.

FIG. 2 depicts a pictorial representation of an example chemiresistive sensor 200, in accordance with an implementation of the present subject matter. The chemiresistive sensor 200 can comprise interdigitated electrodes 202 provided on a sensor substrate 204. In one example, the interdigitated electrode 202 may be fabricated from platinum and the sensor substrate 204 may be fabricated from thermal oxidation of silicon substrate. The chemiresistive sensor 200 can comprise the heterostructure semiconductor 100 as the sensing material. The heterostructure semiconductor 100 may, for example, be deposited on the interdigitated electrodes 202 to bridge the electrodes.

The interdigitated electrodes 202 can comprise two electrically conducting electrodes (not shown in figure) on the sensor substrate 204. In one example, gap between the interdigitated electrodes 202 is in a range of 5 μm. The two electrically conductive electrodes of the interdigitated electrodes 202 may be coupled to a potential generator 206 which establishes a potential difference between the two electrically conducting electrodes for flow of electrons. The potential difference provided by the potential generator 206 may be controlled by a controller 208.

The chemiresistive sensor 200 can also comprise a measurement device 210 coupled to the two electrically conductive electrodes of the interdigitated electrodes 202. The measurement device 210 may measure the current flowing between the electrodes when the heterostructure semiconductor 100 is contacted with the gas to be sensed. In other examples, other electrical parameters, such as resistance, impedance, and the like may be measured by the measurement device 210. The measured electrical parameter can be correlated to the concentration of the gas to sense and quantify the gas. In one example, the controller 208 or another controller may receive the measured electrical parameter from the measurement device 210 and may detect and quantify the gas sensed by the heterostructure semiconductor 100 based on the measured electrical parameter.

In one example, when the chemiresistive sensor 200 is for sensing and quantifying hydrogen sulfide, sensor operating voltage is about 5 V, sensor operating temperature about 250° C., and concentration of hydrogen gas detected by the sensor is in a range of 100 ppb to 5 ppm.

Figure 3:
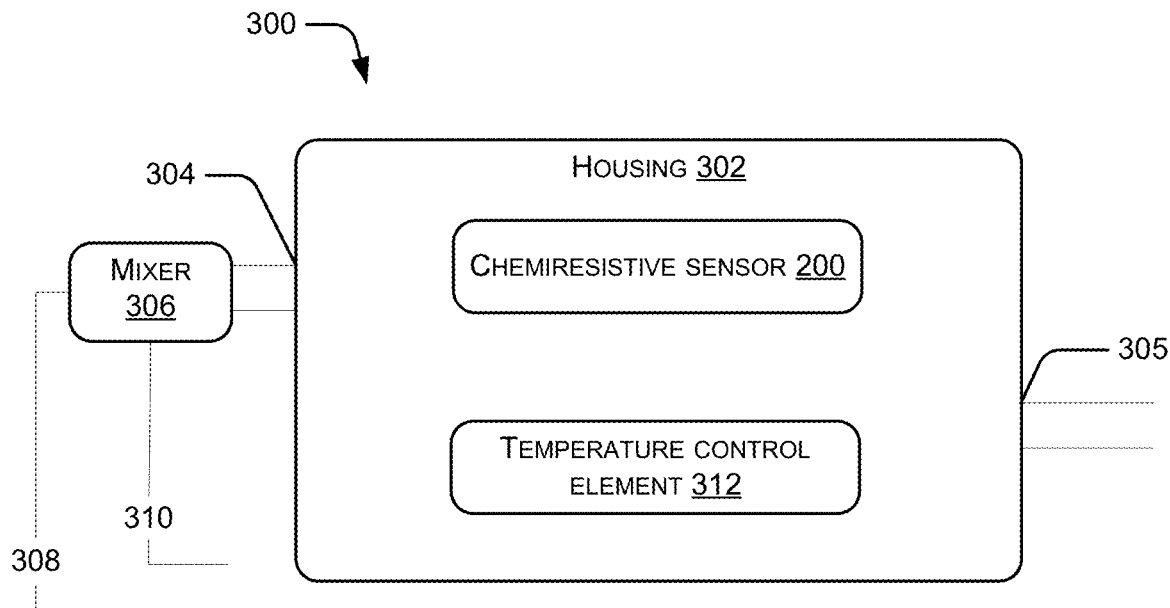
FIG. 3 depicts a gas sensing set up comprising the chemiresistive sensor, in accordance with an implementation of the present subject matter.

FIG. 3 depicts a gas sensing set up 300 comprising the chemiresistive sensor 200, in accordance with an implementation of the present subject matter. The gas sensing set up 300 can include a housing 302 which can house the chemiresistive sensor 200. The housing 302 can include a gas inlet 304 to receive the gas to be detected and an exhaust outlet 305 to exhaust the received gas. In one example, when the gas to be detected is an explosive gas, for purpose of safety, the gas may first be diluted prior to introduction in the housing 302. In said example, a mixer 306 may be provided upstream of the gas inlet 304. The mixer 306 can receive air, for example, via line 308 and feed stream including the gas to be sensed, for example, via line 310. The mixer 306 can mix and dilute the feed stream prior to introduction into the housing 302.

The housing 302 may further include a temperature control element 312. The temperature control element 312 may include, for example, a thermocouple and a controller. The temperature control element 312 can help in maintaining the temperature of the chemiresistive sensor 200 within the operating temperature range during sensing and quantification of the gas.

Thus, by implementing various aspects of the present subject matter, a heterostructure, a chemiresistive sensor, and a gas sensing set up is provided which provides high sensitivity, high selectivity, and low recovery time. The methods used for fabrication of the heterostructure as discussed above will now be further described with reference to FIG. 4.

Figure 4:
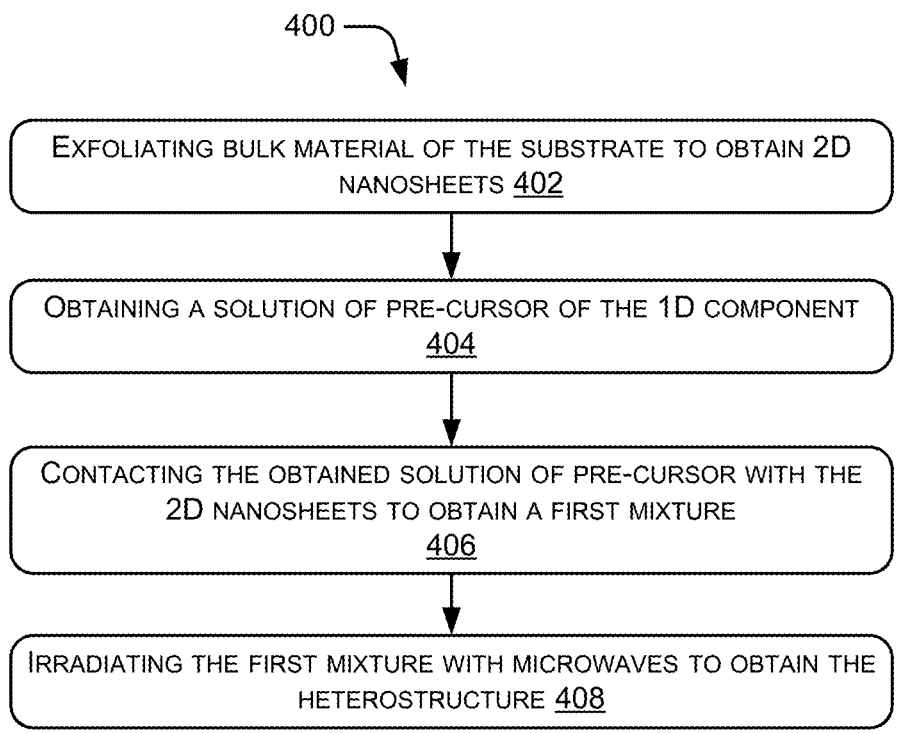
FIG. 4 illustrates an example method for fabricating the heterostructure semiconductor, in accordance with an implementation of the present subject matter.

FIG. 4 illustrates an example method 400 for fabricating the heterostructure semiconductor, in accordance with an implementation of the present subject matter. In one example, the heterostructure fabricated is heterostructure semiconductor 100. The order in which the method 400 is described is not intended to be construed as a limitation, and any number of the described method blocks can be combined in any order to implement method 400 or an alternative method. Additionally, individual blocks may be deleted from the method 400 without departing from the spirit and scope of the subject matter described herein. For discussion, the method 400 is described with reference to the implementations illustrated in FIGS. 1-3.

With reference to method 400, as illustrated in FIG. 4, at block 402, bulk material of a substrate may be exfoliated to obtain a substrate made of 2D nanosheets of a compound of a first metal that is sensitive to a gas to be sensed. In one example, the substrate is substrate 102 which may be fabricated from bulk TMDs. To exfoliate, the bulk material may be dispersed in a dispersing medium and sonicated. In one example, 5-20 mg of bulk material is added per milliliter of the dispersion medium. In one example, the dispersing medium may be ethanol and water mixture comprising 45-75 volume %. The dispersion of the bulk material may be sonicated for 3-6 hours to obtain sonicated bulk material. To obtain the 2D nanosheets, sonicated bulk material may then be subjected to centrifugation where nanosheets with fewer number of layers remain in the supernatant dispersion while the thicker layers are settled at the bottom. The supernatant dispersion is separated to obtain the 2D nanosheets having the fewer number of layers as the substrate. In one example, the centrifugation is performed for 30-60 minutes at 2500-4500 rpm. The 2D nanosheets obtained may have 2-100 atomic layers and a lateral dimension of 100-1000 nm.

In one example, when the bulk material is tungsten disulfide, 10 mg/mL of tungsten disulfide is added to 65% ethanol dispersing medium and subjected to sonication for 5 hours. This is followed by centrifugation for 45 minutes at 3500 rpm. The 2D tungsten disulfide obtained has a 2D layer thickness of about 4 atomic layers and average 2D lateral dimension of 300 nm.

At block 404, the method 400 comprises obtaining a solution of precursor of the 1D components to be formed on the substrate. The 1D components may be made of a compound of a second metal that is selective to the gas to be sensed. The precursor of the 1D components 106 may be selected from the group consisting of Zinc (II) acetylacetonate, Zinc nitrate hexahydrate, Zinc acetate dihydrate, Nickel (II)acetylacetonate, Fe(II)acetylacetonate, metal organic precursors from β-diketonate group, and the like. In one example, the precursor is Zinc (II) acetylacetonate. The obtained precursor may be mixed with a solvent to obtain a solution. In one example, 0.1 mM to 10 mM of the precursor is dissolved in 1-100 volume % of ethanol in water mixture. In one example, 1 mM of Zinc (II) acetylacetonate is dissolved in 85 volume % of ethanol in water.

At block 406, the method 400 comprises contacting the obtained precursor solution with the 2D nanosheets of the substrate to obtain a first mixture. At block 408, the method 400 comprises irradiating the first mixture with microwaves to obtain the heterostructures comprising the 1D components fabricated on a surface of the substrate and a 2D layer formed on the surface of the substrate in portions excluding the 1D components, wherein the 2D layer comprises compounds of the first and second metal. In one example, temperature during irradiation is maintained in the range of 75°-300° C., preferably at 150° C., and the microwave frequency is in a range of 2.45 GHz. The microwave power may be in a range of 50-500 W and may be continuous or cycling. In the cycling mode, a number of cycles may be in a range of 20 to 200 depending on time period of power pulse being on. In the cycling mode, power pulse on time may be in a range of 10-120 seconds. In one example, the irradiation is performed for 2-20 minutes.

In one example, when the 2D nanosheets are fabricated from bulk tungsten disulfide and the 1D component comprises zinc oxide, the temperature during irradiation is 150° C., microwave frequency is 2.45 GHz, microwave power is 300 W. If used in cycling mode, 200 cycles of irradiation may be provided with a pulse on time of 20 seconds. The irradiation may be performed for 12 mins to obtain the heterostructure semiconductor 100.

The resulting heterostructure semiconductor 100 has a non-continuous/patchy 2D layer made of sulphates and oxides of the first and second metal formed on the substrate of the nanosheets of the first metal and 1D components of oxides of the second metal. In the above example, the nanosheets are made of tungsten disulfide, the 2D layer comprises oxides and sulphates of zinc and tungsten, and the 1D component is comprises zinc oxide. The 1D component may be formed as nanorods or nanotubes of length in the range of 10-1000 nm, preferably 500-1000 nm, and diameter in the range of 10-200 nm, preferably 60-80 nm.

The present subject matter will now be illustrated with working examples, which are intended to illustrate the working of disclosure and not intended to be taken restrictively to imply any limitations on the scope of the present disclosure. Unless defined otherwise, all technical and scientific terms used herein have the same meaning as commonly understood to one of ordinary skill in the art to which this disclosure belongs. It is to be understood that this disclosure is not limited to the particular methods and experimental conditions described, as such methods and conditions may vary depending on the process and inputs used as will be easily understood by a person skilled in the art.

EXAMPLES

Example 1: Preparation of Hetero Structure

Figure 5:
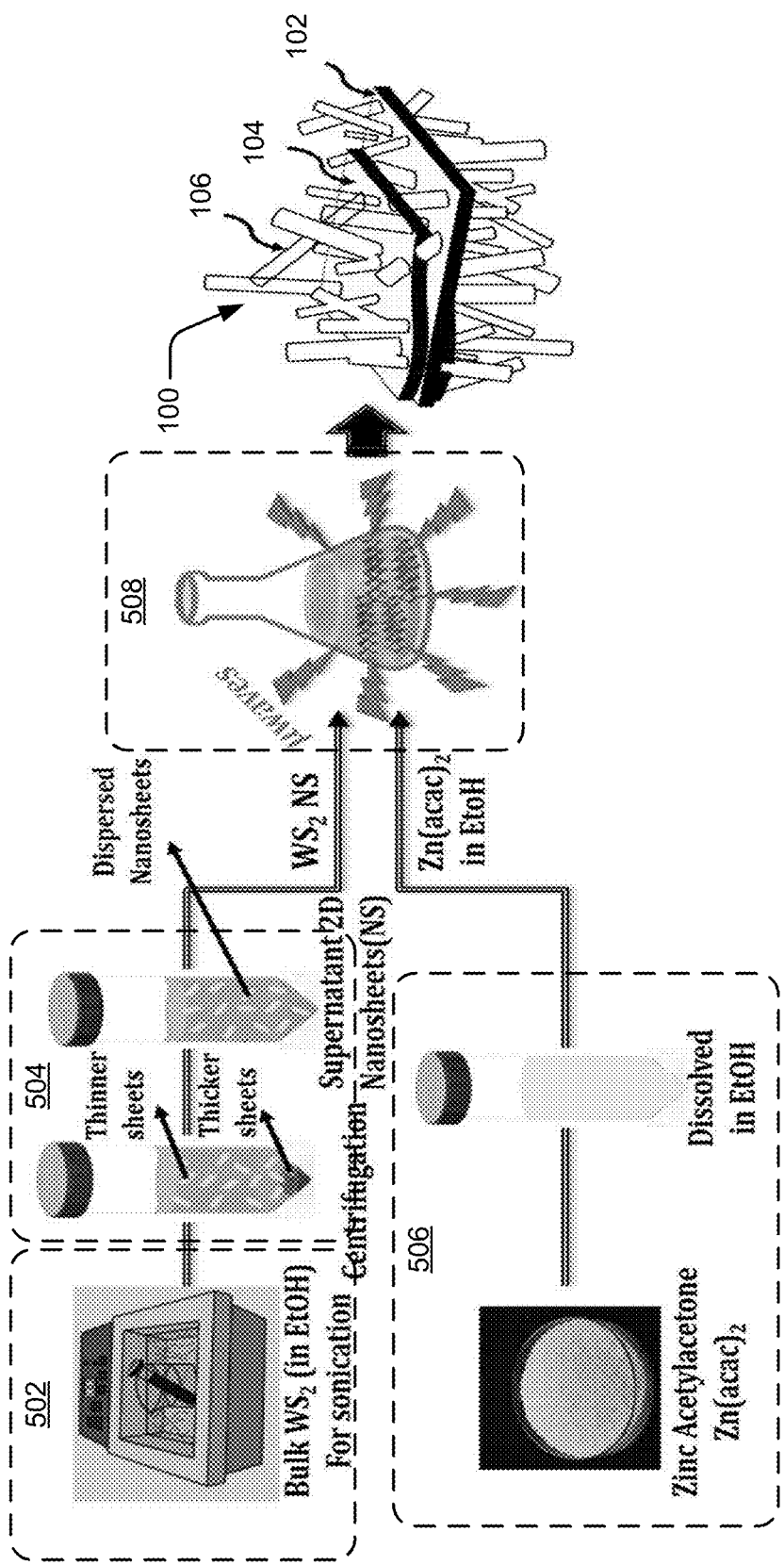
FIG. 5 depicts an example schematic of fabrication of the heterostructure semiconductor, in accordance with an implementation of the present subject matter.

An example heterostructure was fabricated with $WS_2$ as the substrate, ZnO as the 1D component, and the 2D layer being rich in oxides and sulphates of Zn and W. FIG. 5 depicts an example schematic of fabrication of the heterostructure, in accordance with an implementation of the present subject matter. At block 502, tungsten disulfide obtained from Sigma Aldrich is dissolved in a solvent, namely ethanol/water, and subjected to sonication. During sonication, the tungsten disulfide is exfoliated and forms thinner and thicker sheets. At block 504, the sonicated solution is subjected to centrifugation for separation of the thinner and thicker sheets. On centrifugation, the thinner sheets of the tungsten disulfide nanosheets remain suspended in the supernatant liquid. The supernatant liquid can be separated to obtain the 2D tungsten disulfide nanosheets to form the substrate of the heterostructure.

At block 506, precursor of the 1D component, namely, zinc acetylacetone is dissolved in a solvent, namely, ethanol/water. At block 508, the obtained 2D tungsten disulfide nanosheets are contacted with the solution of zinc (II) acetylacetonate and the mixture is subjected to microwave irradiation to obtain the heterostructure semiconductor 100.

The process parameters used for the fabrication as described with reference to FIG. 5 are provided in Table 1 and Table 2 below. It is to be understood that the process parameters are merely illustrative and may vary depending on the materials used for the fabrication of the heterostructure.

TABLE 1

Parameters for preparation of 2D nanosheets

| Parameters | |
| --- | --- |
| Bulk crystal | $WS_2$ |
| Quantity of bulk material | 10 mg/ml |
| Dispersing medium | 65% (vol %) of ethanol |
| Sonication time | 5 hrs |
| Centrifugation | 3500 rpm (45 min) |
| 2D layer thickness | ~4 atomic layer |
| 2D lateral dimension | 300 nm |

TABLE 2

Other parameters for synthesis

| Parameters | |
| --- | --- |
| Temperature | 150° C. |
| Microwave frequency | 2.45 GHz |
| Microwave Power | 300 W Cycling mode 200 cycles |
| Time of deposition (microwave exposure) | 12 min Pulse On time: 20 s |
| Precursors for metal oxides | Zinc (II) acetylacetonate |
| Precursor qty. | 1 mM |
| Solvent | 85% (vol %) ethanol |
| Solvent quantity | 40 ml |

Example 2: Characterization-Scanning Electron Microscopy (SEM) and Transmission Electron Microscopy (Tem)

Field Emission SEM (FESEM) and TEM images of the heterostructure fabricated was obtained. FIG. 6A depicts a large area FESEM image of the heterostructure semiconductor obtained by the method of Example 1, in accordance with an implementation of the present subject matter. FIG. 6B depicts a low magnification TEM image of the heterostructure semiconductor obtained by the method of Example 1, in accordance with an implementation of the present subject matter. FIGS. 6A and 6B indicate the presence of ZnO nanorods on $WS_2$ substrate.

FIG. 6C depicts a cross sectional SEM image of the heterostructure semiconductor obtained by the method of Example 1, in accordance with an implementation of the present subject matter. From FIG. 6C, it can be observed that the ZnO nanorods are protruding at different angles from $WS_2$ nanosheets.

FIG. 6D depicts another TEM image of the heterostructure semiconductor obtained by the method of Example 1, in accordance with an implementation of the present subject matter. From 6D, it can be observed that the nanosheets at some places seemed to curl and encapsulate the nanorods.

FIG. 6E depicts a low magnification TEM micrograph of the heterostructure semiconductor obtained by the method of Example 1, in accordance with an implementation of the present subject matter. The growth of nanorods on both sides of the nanosheet was observed from FIG. 6E.

To further investigate the nucleation of these nanorods onto nanosheets, High resolution TEM was performed. FIG. 6F depicts the high resolution TEM image of the heterostructure semiconductor obtained by the method of Example 1, in accordance with an implementation of the present subject matter. The merging of lattice fringes coming from ZnO (101) and $WS_2$ (100) with the interlayer spacing of 0.25 and 0.27 nm, respectively, was observed, thereby confirming the formation of abrupt interface between the substrate and the 1D component. The Selected Area Electron Diffraction (SAED) pattern shown in inset of FIG. 6F shows high crystallinity of material. The length of nanorods as computed from SEM and TEM micrographs was found to be in the range of 500-1000 nm with the diameter in the range of 60-80 nm.

Example 3: High-Angle Annular Dark Field-Scanning Transmission Electron Microscopy (HAADF-STEM)

The HAADf-STEM image and elemental mapping using STEM shows the spatial distribution of W, S, O, Zn. FIGS. 7A-7F depict the HAADf-STEM images of the heterostructure semiconductor obtained by the method of Example 1, in accordance with an implementation of the present subject matter. From the HAADF-STEM images, it was observed that the oxides and sulphates were localized on the surface of $WS_2$ nanosheets. Here, the elemental STEM mapping of Zn indicated that the zinc sulphates were also present on the surface of nanosheets along with its obvious presence on nanorods. Hence, STEM confirmed the presence of very thin layer (approx. <5 nm) of metal sulphates on the surface of $WS_2$ nanosheets.

Example 4: X-Ray Diffraction Study

Figure 8B:
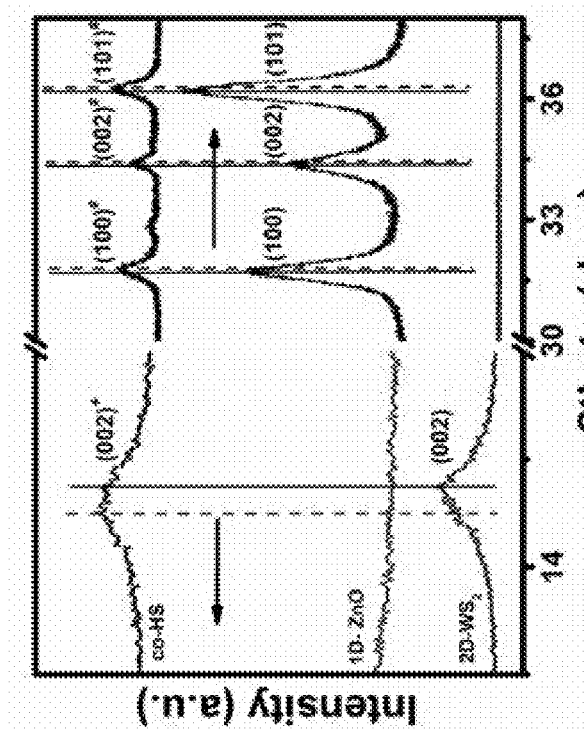
FIG. 8B depicts a magnified image of the XRD pattern of FIG. 8A, in accordance with an implementation of the present subject matter.
Figure 8A:
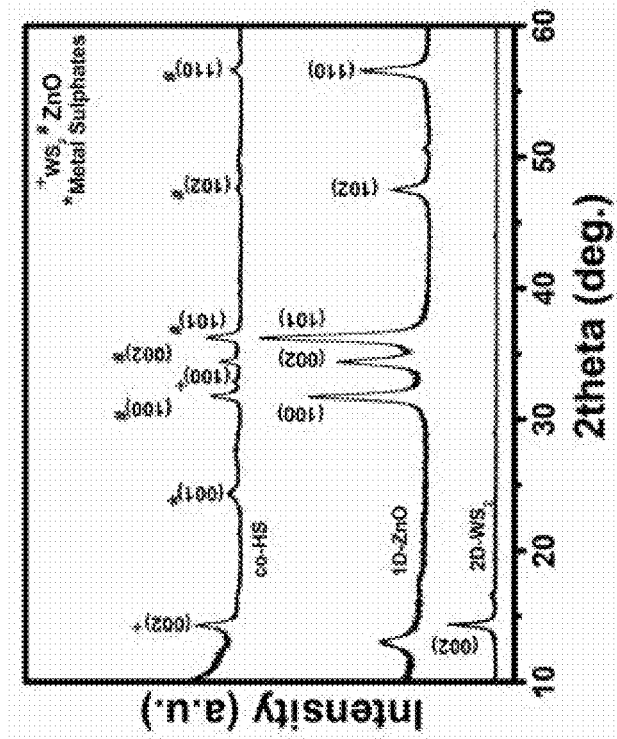
FIG. 8A depicts XRD pattern of the synthesized heterostructure semiconductor, in accordance with an implementation of the present subject matter.

The crystal structure of the as synthesized heterostructure was investigated by XRD as shown in FIG. 8A and FIG. 8B. FIG. 8A depicts XRD pattern of the synthesized heterostructure, in accordance with an implementation of the present subject matter. FIG. 8B depicts a magnified image of the XRD pattern of FIG. 8A, in accordance with an implementation of the present subject matter.

The co-existence of $WS_2$ and ZnO can be clearly seen from the XRD pattern shown in FIG. 8A and FIG. 8B. The peak along (002) axis of 2H—$WS_2$ is evident at 14.27° (JCPDS card:08-0237) while the peak positions "#" marked can be indexed to hexagonal ZnO (JCPDS: 80-0074) in the diffraction pattern of heterostructure. Also, the diffraction peaks from the ZnO NR confirmed the (101) preferred growth axis with the peak position centered at 36.23°.

It was observed from FIG. 8A and FIG. 8B that there is a left shift in $WS_2$ peak position and a right shift in ZnO peak positions in the heterostructure as compared to the pristine $WS_2$ and ZnO shown in dotted lines in the FIG. 8B. This is indicative of compressive stress (due to $WS_2$) and tensile stress (due to ZnO) induced at the interface due to the formation of heterojunction. Also, the full width at half maximum (FWHM) corresponding to $WS_2$ peak in the heterostructure (0.479) is broader compared to pristine $WS_2$ (0.254), suggesting peak broadening in the heterostructure due to developed strain. Thus, these shifts in peak positions and broadening of peak width strongly indicate the formation of an abrupt interface between 1D ZnO and 2D $WS_2$.

In addition to these peaks, a broad peak at 24.33° was also observed that indicates the presence of the nanocrystalline monoclinic zinc oxide sulphate phase (JCPDS card no. 71-2475). The formation of such metal sulphate phase can plausibly attribute to the processing involved in the nucleation of ZnO on $WS_2$ in oxygen rich environment in presence of abundant hydroxyl (OH⁻) group. To further investigate the complex chemical composition of the heterostructure, XPS study was performed.

Example 5: X-Ray Photoelectron Spectroscopy

FIG. 9A-9D depict spectra obtained from XPS studies of the heterostructure semiconductor obtained by the method of Example 1, in accordance with an implementation of the present subject matter. The deconvoluted tungsten spectra (refer FIG. 9A) revealed the intense peaks centered at 31.69 eV and 33.89 eV that corresponds to W $4f_{7/2}$ and $4f_{5/2}$, confirming the presence of $W^{4+}$ state. In addition to these peaks, two more peaks at 35.50 eV and 37.59 eV were observed which indicated the existence of +6 oxidation state of tungsten. The sulphur $2p_{3/2}$ and $2p_{1/2}$ orbitals centered at binding energies of 161.37 and 162.41 eV, respectively, confirmed the existence of $S^{2-}$ (refer FIG. 9 B). In the high resolution XPS spectra of Zn 2p as shown in FIG. 9C, the binding energies found at 1021.71 and 1044.81 eV corresponds to Zn $2p_{3/2}$ and $2p_{1/2}$, respectively, suggesting the presence of $Zn^{2+}$ in the prepared heterostructure. This is further confirmed from a typical characteristic peak of metal bonded to oxygen at 530.09 eV in O1 s spectra (refer FIG. 9 D). Therefore, the coexistence of ZnO and $WS_2$ in the heterostructure was confirmed.

Example 6: Gas Sensing Studies

Figure 10A:
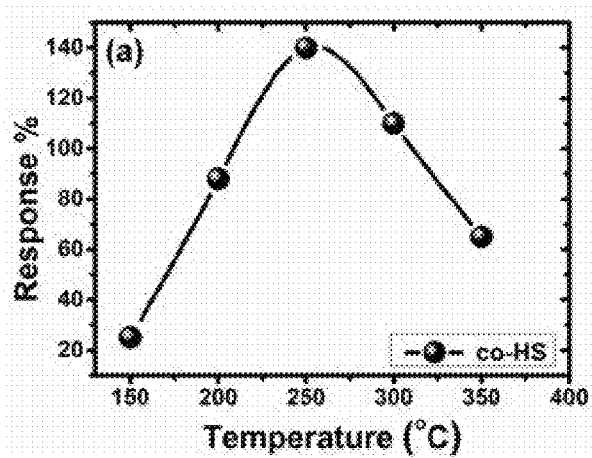
FIG. 10A depicts gas sensing by the heterostructure semiconductor as a function of temperature, in accordance with an implementation of the present subject matter.

The efficacy of the heterostructure in sensing hydrogen sulfide was studied. The gas sensing setup as shown in FIG. 3 was used with the heterostructure semiconductor obtained by the method of Example 1. The gas sensing measurements were then carried out in a volumetric rectangular chamber integrated with a Keithley SMU 2450, a Eurotherm temperature controller, and Alicat mass flow controllers. Initially, the gas sensing properties of the heterostructure was investigated at different temperatures. The dynamic properties (response magnitude, response/recovery time) of a gas sensor is a function of temperature since adsorption/desorption is a temperature dependent phenomenon. FIG. 10A depicts gas sensing by the heterostructure as a function of temperature, in accordance with an implementation of the present subject matter. The response towards 5 ppm of $H_2S$ was measured at different temperatures ranging from room temperature to 350° C. as shown in FIG. 10A. The "bell-shaped" temperature dependent curve of the sensor response is consistent with the theoretical study reported in literature.

Figure 10B:
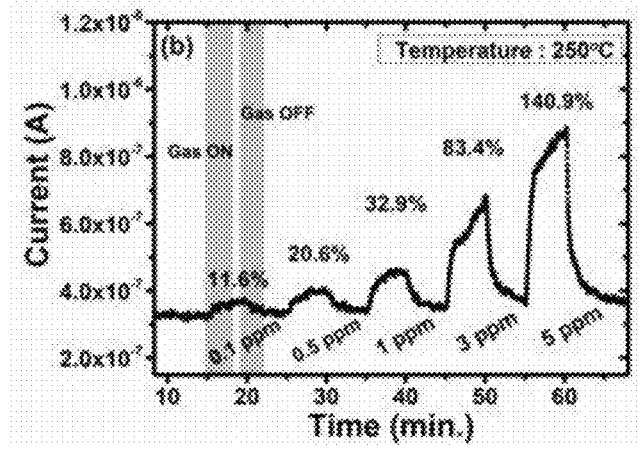
FIG. 10B depicts gas sensing response of the heterostructure semiconductor at different concentrations of gas, in accordance with an implementation of the present subject matter.

To further investigate the variation of response magnitude with varying concentrations, the dynamic sensing response was recorded towards 100 ppb to 5 ppm of $H_2S$ at an optimized temperature of 250° C. as shown in FIG. 10B. FIG. 10B, thus, depicts gas sensing response of the heterostructure at different concentrations of gas, in accordance with an implementation of the present subject matter. The sensor showed a clear response to 0.1 ppm (100 ppb) $H_2S$ while the response magnitude increases gradually with increase of $H_2S$ concentration. The sensor exhibited the response values in the range of 11.6% to 140% while spanning the concentration range from 100 ppb to 5 ppm.

Figure 10C:
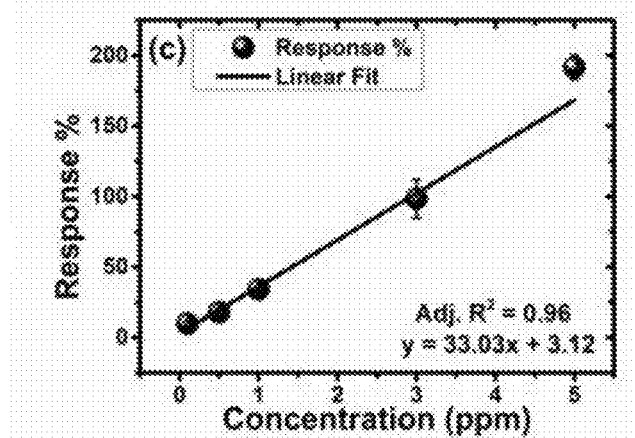
FIG. 10C depicts linear fitting of response (in %) versus concentration plot, in accordance with an implementation of the present subject matter.

FIG. 10C depicts linear fitting of response (in %) versus concentration plot, in accordance with an implementation of the present subject matter. The sensitivity derived from the linear fitting of experimental result was found to be 33%/ppm.

Figure 11A:
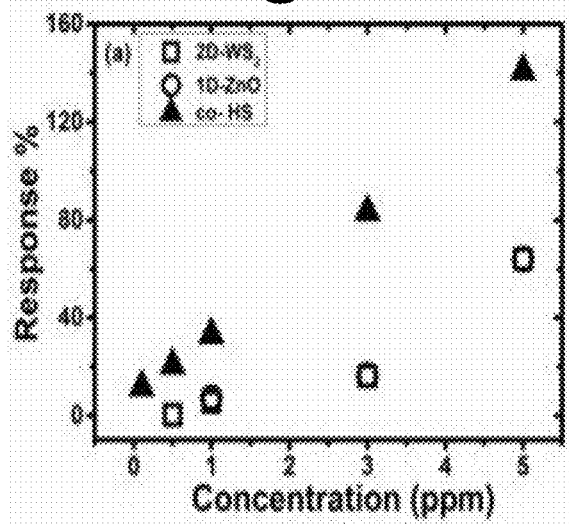
FIG. 11A depicts comparison of responses (in %) of pristine $WS_2$, pristine ZnO, and the heterostructure, in accordance with an implementation of the present subject matter.

FIG. 11A depicts comparison of responses (in %) at different concentrations of hydrogen sulfide with sensor having only $WS_2$ (2D-$WS_2$), sensor having only ZnO (1D-ZnO), and the 2D/1D co-existing heterostructure prepared by example 1 (co-HS), in accordance with an implementation of the present subject matter. It can be observed that the response to $H_2S$ seemed to enhance by more than 5 times as compared to pristine $WS_2$ and ZnO. This can be attributed to the increase in electron conduction paths due to the formation of heterostructure.

The heterostructure was then tested for seven different interfering gases namely acetone, $NH_3$, $CH_4$, $H_2$, CO, $SO_2$ and $CO_2$ to ascertain its specificity to a particular analyte. It can be observed that the sub-ppm detection of the chemiresistive sensor can find potential application in breath analysis, hence, are the gases chosen accordingly (depending on its levels in breath). The concentration of gases tested were in accordance with the medically relevant range reported in literature, such as, acetone at mean conc. of 1.8 ppm here is linked to diabetes, 1 ppm $NH_3$ for Chronic kidney disease, 20 ppm $H_2$ and 20 ppm $CH_4$ for lactose intolerance, and the like.

Figure 11B:
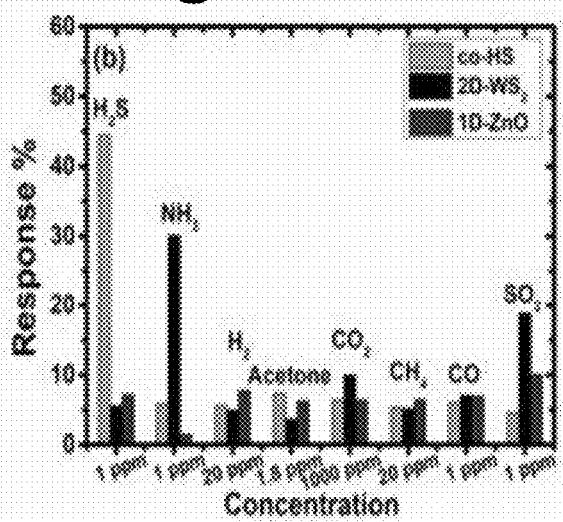
FIG. 11B depicts a histogram plot illustrating selectivity of the chemiresistive sensor employing pristine materials and fabricated heterostructure, in accordance with an implementation of the present subject matter.

FIG. 11B depicts a histogram plot illustrative selectivity of the chemiresistive sensor employing pristine materials and the prepared heterostructure, in accordance with an implementation of the present subject matter. From FIG. 11B, it was observed that the chemiresistive sensor selectively responds more than 5 times at 1 ppm of $H_2S$ as compared to the other gases tested at relevant concentrations. It was also observed that the achieved specificity is much better as compared to the pristine $WS_2$ and ZnO. It can be observed from FIG. 11B that $WS_2$ is selective to $NH_3$ and shows very poor response towards $H_2S$ while ZnO histogram demonstrates very poor performance both in terms of sensitivity and selectivity towards $H_2S$. Therefore, in addition to the enhancement in response value, it makes the chemiresistive sensor more selective since embedding ZnO nanorods onto $WS_2$ nanosheets suppresses $NH_3$ sensing which was otherwise prominent with pristine $WS_2$ and makes it selective towards $H_2S$.

Figure 11C:
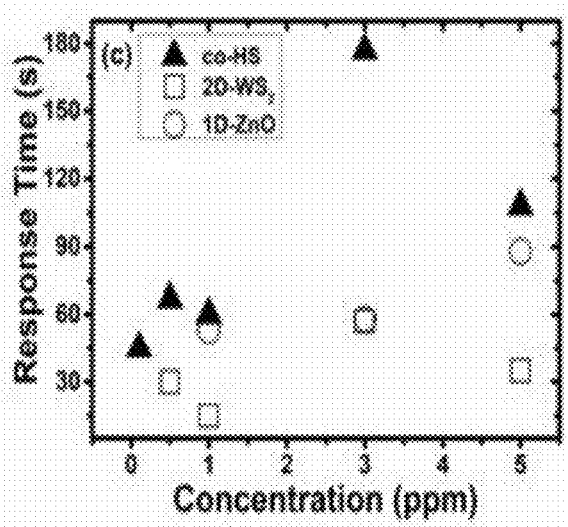
FIGS. 11C and 11D depicts variation of response time and recovery time with varying concentration of hydrogen sulfide, in accordance with an implementation of the present subject matter.
Figure 11D:
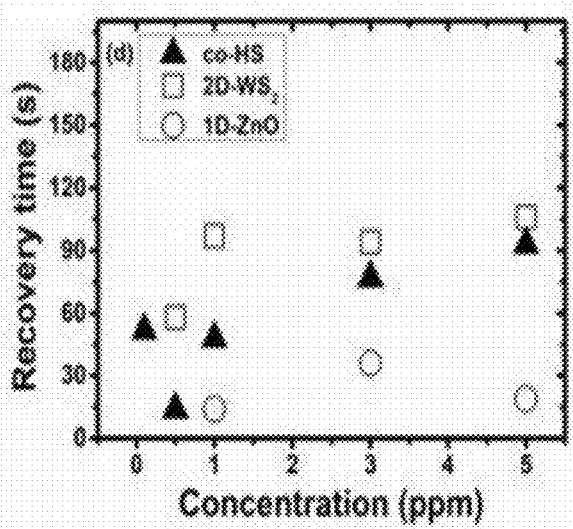

FIG. 11C and FIG. 11D depicts variation of response time and recovery time with varying concentration of hydrogen sulfide, in accordance with an implementation of the present subject matter. The chemiresistive sensor shows faster recovery of less than 50 sec (FIG. 11C) at the concentrations of 1 ppm and lesser, with remarkable achievement of 14 sec at 500 ppb (FIG. 11D). It supersedes pristine $WS_2$ based devices in scale of recovery time and competes well with ZnO based devices which possess even better recovery time. This indicates that the heterostructure formation has not compromised the response and recovery behavior of the sensor.

Example 7: Stability Studies were Conducted

Figure 12A:
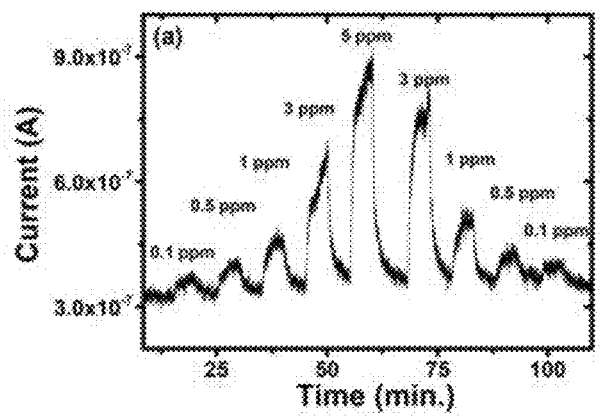
FIG. 12A-12B depicts results of studies of hysteresis loss, in accordance with an implementation of the present subject matter.
Figure 12B:
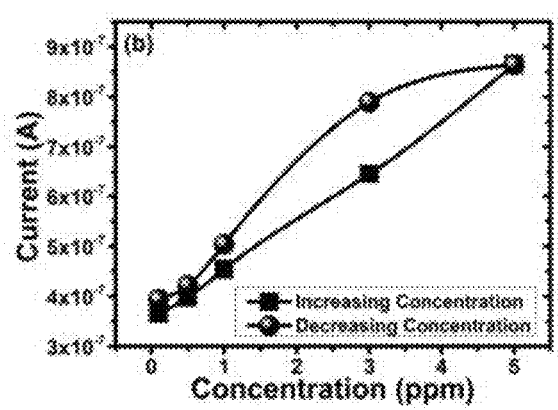

FIG. 12A-12B depicts results of studies of hysteresis loss, in accordance with an implementation of the present subject matter. The hysteresis error (%) in the sensor response was found to be ±4.21%.

Figure 12C:
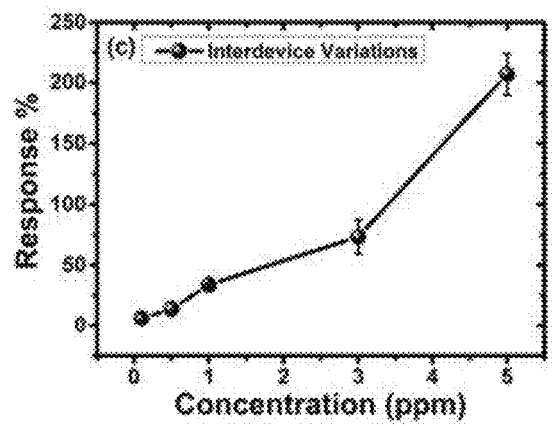
FIG. 12C depicts inter-sensor variation, in accordance with an implementation of the present subject matter.

FIG. 12C depicts inter-sensor variation, in accordance with an implementation of the present subject matter. The minimal variation of <5% observed at concentrations less than 3 ppm while slightly higher deviation of ±10% at higher concentration as seen in FIG. 12C.

Figure 12D:
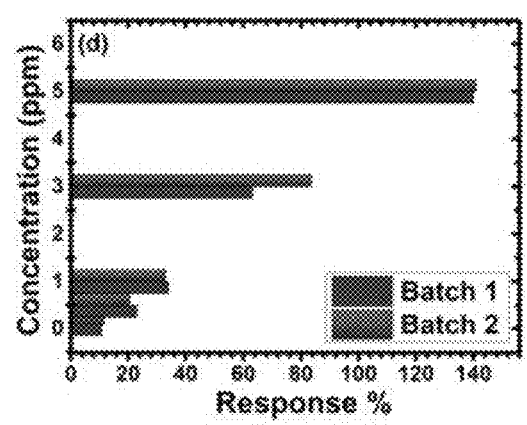
FIG. 12 D depicts batch-to-batch variation in response (%), in accordance with an implementation of the present subject matter.

FIG. 12D depicts batch-to-batch variation in response (in %), in accordance with an implementation of the present subject matter. The chemiresistive sensor shows very little batch-to-batch variation in response.

The heterostructure based chemiresistive sensor of the present subject matter, thus, provides high sensitivity, selectivity, and prompt detection. The heterostructure based chemiresistive sensor provides a sensitivity of 100 ppb to 5 ppm. The chemiresistive sensor also do not compromise the response/recovery time. The fabrication of the heterostructure is simple and does not need high thermal conditions. Hence, the fabrication is scalable for bulk manufacturing of the heterostructures and, consequently, the chemiresistive sensors.

Although the subject matter has been described in considerable detail with reference to certain examples and implementations thereof, other implementations are possible. As such, the scope of the present subject matter should not be limited to the description of the preferred examples and implementations contained therein.

We claim:

1. A heterostructure semiconductor for sensing a gas, the heterostructure semiconductor comprising:
    a substrate made of nanosheets of a compound of a first metal, wherein the compound of the first metal is sensitive to the gas to be sensed;
    one or more 1-Dimensional (1D) components fabricated on a surface of the substrate, the 1D components comprising a compound of a second metal, wherein the compound of the second metal is selective to the gas to be sensed; and
    a 2-Dimensional (2D) layer formed on the surface of the substrate in portions excluding the 1D components, wherein the 2D layer comprises compounds of the first and second metal.

2. The heterostructure semiconductor as claimed in claim 1, wherein the 1D components are nanorods or nanotubes.

3. The heterostructure semiconductor as claimed in claim 1, wherein the first metal is selected from tungsten and molybdenum and the second metal is selected from zinc, nickel, and iron.

4. The heterostructure semiconductor as claimed in claim 1, wherein the compound of the first metal forming the nanosheets of the substrate is a transition metal dichalcogenide (TMD).

5. The heterostructure semiconductor as claimed in claim 1, wherein the compound of the second metal forming the 1D component is a metal oxide.

6. The heterostructure semiconductor as claimed in claim 1, wherein the 2D layer comprises sulfates and oxides of first and second metals.

7. The heterostructure semiconductor as claimed in claim 1, wherein the gas to be sensed is hydrogen sulfide, the substrate is made of tungsten disulfide, the 2D layer comprises oxides and sulphates of tungsten and zinc, and the 1D component comprises zinc oxide.

8. The heterostructure semiconductor as claimed in claim 1, wherein the substrate has a thickness of 2-100 atomic layers, preferably 4 atomic layers, and a lateral dimension of 100-1000 nm, preferably 300 nm.

9. The heterostructure semiconductor as claimed in claim 1, wherein the 1D component has a length in a range of 10-10000 nm, preferably 500-1000 nm, and diameter in a range of 10-200 nm, preferably 60-80 nm.

10. The heterostructure semiconductor as claimed in claim 1, wherein an abrupt interface exists between the substrate and the 1D components; and a longitudinal axis of each of the 1D components is at angle to a plane of the substrate.

11. A chemiresistive sensor comprising the heterostructure semiconductor as claimed in claim 1, the chemiresistive sensor comprising:
    interdigitated electrodes;
    the heterostructure semiconductor deposited on the interdigitated electrodes to bridge the interdigitated electrodes;
    a potential generator to apply potential across the interdigitated electrodes;
    a measurement device to measure an electrical parameter across the interdigitated electrodes; and
    a controller to control the potential applied and detect and quantify the gas sensed by the heterostructure electrodes based on the measured electrical parameter.

12. A method for fabrication of a heterostructure semiconductor for sensing a gas, the method comprising:
    obtaining a substrate, wherein the substrate is made of nanosheets of a compound of a first metal, wherein the compound of the first metal is sensitive to the gas to be sensed;
    obtaining a solution of a precursor of 1D components to be formed on the substrate, wherein the 1D components are made of a compound of a second metal, wherein the compound of the second metal is selective to the gas to be sensed;
    contacting the solution of the precursor of the 1D component with the substrate to obtain a first mixture; and
    irradiating the first mixture with microwaves to form the heterostructure comprising one or more of the 1-Dimensional (1D) components fabricated on a surface of the substrate and a 2-Dimensional (2D) layer formed on the surface of the substrate in portions excluding the one or more of the 1-Dimensional (1D) components, wherein the 2D layer comprises compounds of the first and second metal.

13. The method as claimed in claim 12, wherein the irradiation is performed at a temperature of 75-300 deg C., preferably 150 deg C.

14. The method as claimed in claim 12, wherein the irradiation is performed with microwaves at a frequency of 2.45 GHz and power of 50 W-500 W in continuous or cycling mode.

15. The method as claimed in claim 14, wherein, in the cycling mode, the irradiation is performed for a total time of 2 min-20 min with pulse ON time of 10-120 s.

16. The method as claimed in claim 12, wherein the precursor of the 1D component is selected from the group consisting of Zinc (II) acetylacetonate, Zinc nitrate hexahydrate, Zinc acetate dihydrate, Nickel (II) acetylacetonate, Fe(II)acetylacetonate, and metal organic precursors from β-diketonate group.

17. The method as claimed in claim 16, wherein the solution of the precursor comprises 0.1 mM to 10 mM of the precursor dissolved in 1-100 volume % of ethanol in water mixture.

18. The method as claimed in claim 12, wherein the gas to be sensed is hydrogen sulfide, the substrate is made of tungsten disulfide, the 2D layer comprises oxides and sulphates of tungsten and zinc, and the 1D component comprises zinc oxide.

19. The method as claimed in claim 12, wherein obtaining the substrate comprises:
    exfoliating bulk material of the compound of the first metal to obtain 2D nanosheets by dispersing the bulk material in a dispersing medium and sonicating the dispersion;

centrifuging the sonicated bulk material to obtain a supernatant dispersion; and separating the supernatant to obtain 2D nanosheets as the substrate.

20. The method as claimed in claim 19, wherein for exfoliation, 5-20 mg of bulk material is added per milliliter of the dispersion medium comprising an ethanol and water mixture of 45-75 volume % of ethanol and sonicated for 3-6 hours; and the centrifugation is performed for 30-60 minutes at 2500-4500 rpm to obtain the 2D nanosheets having 2-100 atomic layers and a lateral dimension of 100-1000 nm.

* * * * *